(12) United States Patent
Fischer et al.

(10) Patent No.: US 6,744,279 B2
(45) Date of Patent: Jun. 1, 2004

(54) DATA REGISTER WITH INTEGRATED SIGNAL LEVEL CONVERSION

(75) Inventors: Helmut Fischer, Oberhaching (DE); Ioannis Chrissotomidis, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/132,388

(22) Filed: Apr. 26, 2002

(65) Prior Publication Data

US 2002/0159302 A1 Oct. 31, 2002

(30) Foreign Application Priority Data

Apr. 27, 2001 (DE) .......................... 101 20 672

(51) Int. Cl.[7] ........................................ H03K 19/0175
(52) U.S. Cl. .............................. 326/81; 326/68; 326/80
(58) Field of Search .............................. 326/62, 63, 68, 326/80, 81; 327/333

(56) References Cited

U.S. PATENT DOCUMENTS 4,612,659 A  9/1986  Starke
5,949,721 A  9/1999  Kwon et al.
6,005,432 A * 12/1999 Guo et al. ................. 327/333

FOREIGN PATENT DOCUMENTS

DE  19738726  7/1998

\* cited by examiner

*Primary Examiner*—Anh Tran
(74) *Attorney, Agent, or Firm*—Greenblum & Bernstein P.L.C.

(57) ABSTRACT

Data register for storage of a data bit with integrated signal level conversion. The data register has an input for application of a data bit input signal which has a first voltage shift between a reference ground potential and a first voltage potential, a controllable switching device for passing on the applied data bit signal, a potential isolating transistor having a control connection at the first voltage potential, a first inverter which emits, in inverted form, the passed-on data bit input signal as a data bit output signal having a second voltage shift between the reference ground potential and a second supply potential, at one output of the data register for further data processing, and a second inverter, which feeds back the data output signal for storage of the data bit.

10 Claims, 6 Drawing Sheets

DATA REGISTER WITH INTEGRATED SIGNAL LEVEL CONVERSION

The invention relates to a data register for storage of a data bit with integrated signal level conversion.

In many applications, it is necessary to store a data bit, which originates from a data source, in a data register or in a buffer store, and to carry out voltage level conversion for further data processing. The reason for this is that, because of the technology, the data source in many cases operates with a different signal level shift than a downstream data processing circuit.

FIG. 1a shows an arrangement according to the prior art. A data source which is supplied with a first supply voltage v1 generates data which is written to a data register. Signal matching is carried out in a downstream level converter circuit by raising or lowering the voltage shift of the signal, and the matched signal is supplied to the data processing unit, which is supplied with a second supply voltage v2.

FIG. 1b shows a further arrangement according to the prior art, in which signal matching is first of all carried out by signal level conversion, and the already matched signal is then buffer-stored in a data register for further data processing.

By way of example, FIG. 2 shows the circuitry design of the arrangement according to the prior art illustrated in FIG. 1a. The data register has a controllable switching device which comprises two complementary field-effect transistors T1, T2, with a control signal S and a control signal s̄, which is inverted with respect to the control signal S, driving the gate connections of the two field-effect transistors. In the example illustrated in FIG. 2, an NMOS transistor is driven by a control signal s, and a PMOS transistor, which is complementary to it, receives the inverted control signal s̄. If the control signal s is a logic high, the data signal which is applied to the data input E and originates from the data source is passed on to the input of an inverter stage.

The first inverter stage, which comprises the complementary field-effect transistors T5, T6, of the data register couples the applied data bit, in inverted form, to a second inverter stage 0, which, in the example illustrated in FIG. 2, comprises the field-effect transistors T3, T4. The feedback or latching results in the data bit that has been read being held or buffer-stored in the data register. The data register, together with its two inverter stages, is supplied with a first supply voltage v1.

In order to increase the voltage level shift, the data register output side is connected to a signal level converter. The signal level converter contains a potential isolating transistor T7, whose gate is connected to the first supply voltage. Furthermore, the signal level converter contains an inverter stage which comprises two complementary field-effect transistors T9, T10, which feeds back the applied data signal, in the inverted form, via a feedback transistor T8. The feedback transistor T8 is connected to a second supply voltage v2. The first supply voltage v1 is lower than the second supply voltage v2, with, for example, the first supply voltage being 1.8 volts, and the second supply voltage being 3.3 volts. The feedback results in the voltage level being increased, and the data signal D is emitted with an increased voltage shift to the downstream data processing unit for further data processing.

The circuit arrangement according to the prior art has the disadvantage that the circuit arrangement comprises two circuit modules, namely a data register on the one hand and a level converter on the other hand. A relatively large number of transistors T1 to T10 are thus required in order to buffer-store a data bit and to carry out signal level matching. Furthermore, the signal delay times are relatively long, because the data register and the level converter are connected in series.

The object of the present invention is thus to provide a data register which, in addition to buffer storage of the data bit, also carries out signal level conversion, with little circuitry complexity.

The invention provides a data register for storage of a data bit with integrated signal level conversion, having an input for application of a data input signal which has a first signal voltage shift between a reference ground potential and a first voltage potential, a controllable switching device for passing on the applied data bit input signal, a potential isolating transistor whose control connection is at the first voltage potential, a first inverter which emits, in inverted form, the passed-on data input bit signal as a data output signal which has a second voltage shift between the reference ground potential and a second supply potential, at one output of the data register for further data processing, and a second inverter, which feeds back the data output signal for buffer storage of the data bit signal.

One advantage of this data register according to the invention is that the signal delay time between the input of the data register and the output of the data register is short, so that a data bit which originates from a data source is passed with a short delay time and at the necessary voltage level for further data processing to a downstream data processing unit.

In one preferred embodiment of the data register according to the invention, the first voltage potential v1 is lower than the second voltage potential v2.

The second inverter is preferably supplied with the first voltage potential v1, and the data output signal is fed back to a first potential node between the controllable switching device and the potential isolating transistor.

In one preferred embodiment, the first inverter and the second inverter each contain a PMOS and an NMOS field-effect transistor.

The isolating transistor is preferably an NMOS field-effect transistor.

In one preferred embodiment of the data register according to the invention, a feedback transistor is provided, which feeds back the data output signal to the gate connection of the PMOS field-effect transistor in the first inverter. The feedback transistor is preferably a PMOS field-effect transistor.

In a further embodiment of the data register according to the invention, the second inverter is supplied with the second voltage potential, and the data output signal is fed back to a second potential node between the potential isolating transistor and the first inverter.

In one preferred embodiment, the first potential node is connected to the gate connection of the NMOS field-effect transistor in the first inverter.

The controllable switching device for the data register according to the invention has, in one preferred embodiment, a PMOS field-effect transistor and an NMOS field-effect transistor.

BRIEF DESCRIPTION OF THE DRAWINGS

Preferred embodiments of the data register according to the invention will be described in the following text with reference to the attached figures, in order to explain features which are essential to the invention. In the figures.

Figure 3:
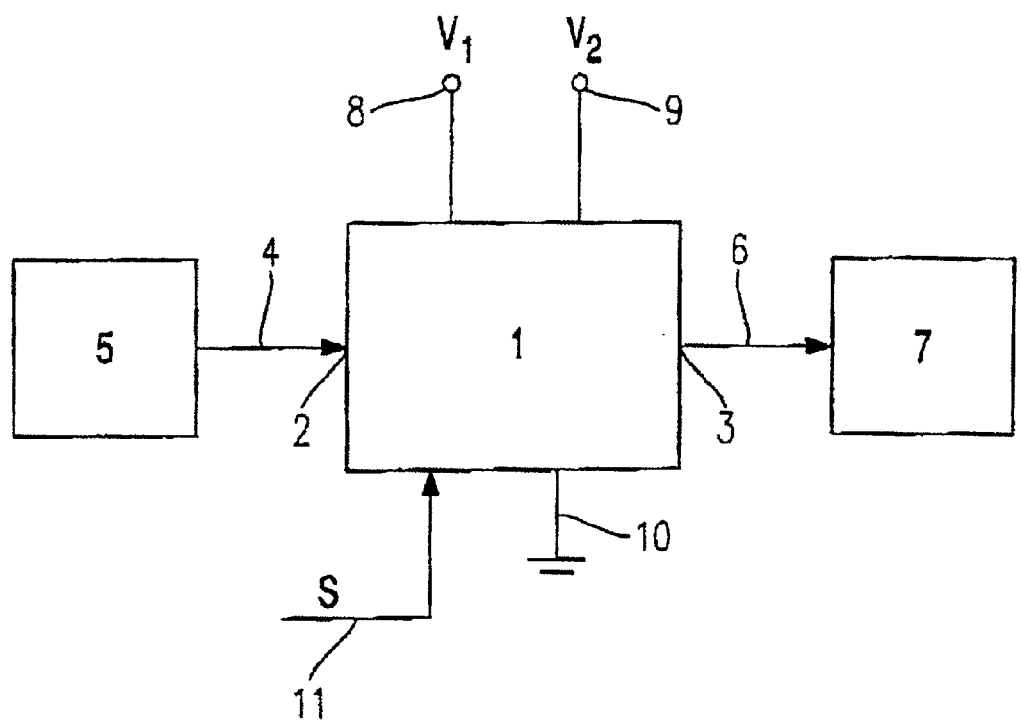
FIG. 3 shows a circuit arrangement according to the invention.

As can be seen from FIG. 3, the data register 1 according to the invention for storage of a data bit with integrated signal level conversion has a signal input 2 and a signal output 3. The signal input 2 receives a data bit input signal via a line 4 from a digital data source 5. The output of the data register 1 is connected via a line 6 to a digital data processing unit 7. The data register 1 buffer-stores the applied data bit input signal, and at the same time carries out signal voltage level matching for the further data processing in the data processing unit 7.

Figure 4:
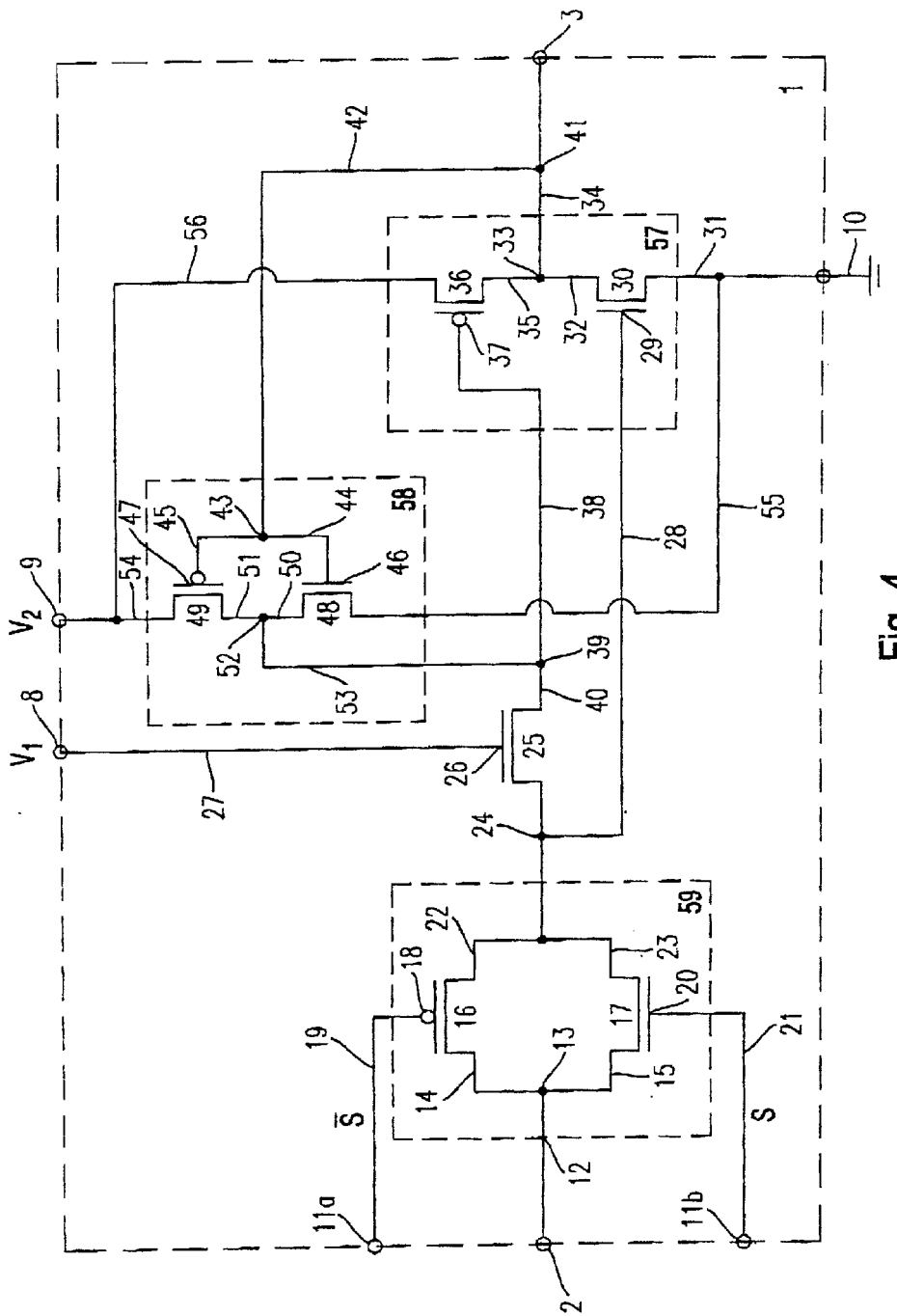
FIG. 4 shows a first embodiment of the data register according to the invention.

FIG. 4 shows a first embodiment of the data register 1 according to the invention. In this case, the data register 1 according to the invention is supplied via supply voltage connections 8, 9 with a first supply voltage of, for example, 1.8 volts and with a second supply voltage of, for example, 3.3 volts. Furthermore, the data register 1 is connected to a reference ground potential, namely ground, via a line 10. In addition, the data register 1 receives a control signal S via a control line 11, in order to write the data bit which is applied to the input 2 to the data register 1.

FIG. 4 shows a first embodiment of the data register 1 according to the invention for storage of a data bit with integrated signal level conversion. The signal input 2 of the data register 1 is connected via a line 12 to a branching node 13, which is connected via lines 14, 15 with a PMOS transistor 16 and an NMOS transistor 17, which is complementary to it. The PMOS transistor 16 has a gate connection 18, which receives an inverted control signal V̄ via a control line 19. The NMOS field-effect transistor 17 likewise has a gate connection 20, which receives a control signal S via a control line 21. If the switching control signal is logic high and the control signal V̄, which is complementary to it, is logic low, the two field-effect transistors 16, 20 are switched on, and pass on the data bit input signal, which is applied to the data input 2, via lines 22, 23 to a potential node 24. The potential node 24 is connected to a potential isolating transistor 25 which, in the case of the circuit illustrated in FIG. 4, is an NMOS field-effect transistor. The potential isolating transistor 25 has a gate connection 26, which is connected via a line 27 to the first supply voltage connection 8, and is at a first voltage potential V1. The normally-off NMOS field-effect transistor 25 is always switched on by the high potential at the gate connection. The potential node 24 is connected via a line 28 to a gate connection 29 of an NMOS field-effect transistor 30. The NMOS field-effect transistor 30 is connected via a line 31 to the reference ground potential connection 10, and is connected via a line 32 to a node 33. The node 33 is connected via a line 34 to the signal output 3 of the data register 1. A PMOS field-effect transistor 36 is furthermore connected via a line 35 to the node 33, and its gate connection 37 is connected via a line 38 to a node 39, which is itself connected via a line 40 to the potential isolating transistor 25.

A branching node 41 in the line 34 is connected via a feedback line 42 to a branching node 43, which is connected via lines 44, 45 with the gate connections 46, 47 of an NMOS field-effect transistor 48 and of a PMOS field-effect transistor 49. The two field-effect transistors 48, 49 are connected via lines 50, 51 to a node 52, which is connected via a line 53 to the potential node 39. The PMOS field-effect transistor 49 is connected via a line 54 to the supply voltage connection 9, and is supplied with voltage at the high supply voltage v2. The complementary NMOS field-effect transistor 48 is connected via a line 55 to the reference ground potential. The high supply voltage v2 supplies not only the PMOS field-effect transistor 49 but also the PMOS field-effect transistor 36 with the high supply voltage v2 via a line 56.

The data register 1 according to the invention contains a first inverter circuit 57, which is formed by the two field-effect transistors 30, 36, and a second inverter circuit 58, which is formed by the two field-effect transistors 48, 49. Furthermore, the data register 1 according to the invention contains a controllable switching device 59, which contains the two complementary field-effect transistors 16, 17.

If the controllable switching device 59 is activated by the control signal S via the control connections 11a, 11b, the data bit input signal which is applied to the data input 2 is passed on to the node 24. A logic-high data input bit is at a high voltage level, which corresponds to the first supply voltage v1. If the logic-high data input bit is passed on, the potential at the node 24 is the first supply voltage v1. The potential isolating transistor 25 is always [lacuna] or has a low impedance, so that a logic-high potential is produced at the potential node 39, which corresponds to the first supply voltage potential minus the threshold voltage of the potential isolating transistor. The PMOS transistor 36 changes to having a high impedance as a result of the rise in the potential, and the complementary NMOS transistor 30 in the first inverter stage 57 receives the supply voltage potential V1 which is applied to the node 24. Since the PMOS field-effect transistor 36 has a high impedance, the voltage potential at the signal output 3 of the data register decays, and is fed back via the line 42 of the second inverter circuit 58, so that the potential at the node 39 rises in the [sic] second reference voltage ground potential v2. The logic-high data bit which was read from the data source 5 at a voltage level v1 via the controllable switching device 59 is buffer-stored at the node 39 as a logic-high data bit at a high voltage level v2, and is available for further data processing via a data processing unit 7, which is connected to the output 3.

Figure 5:
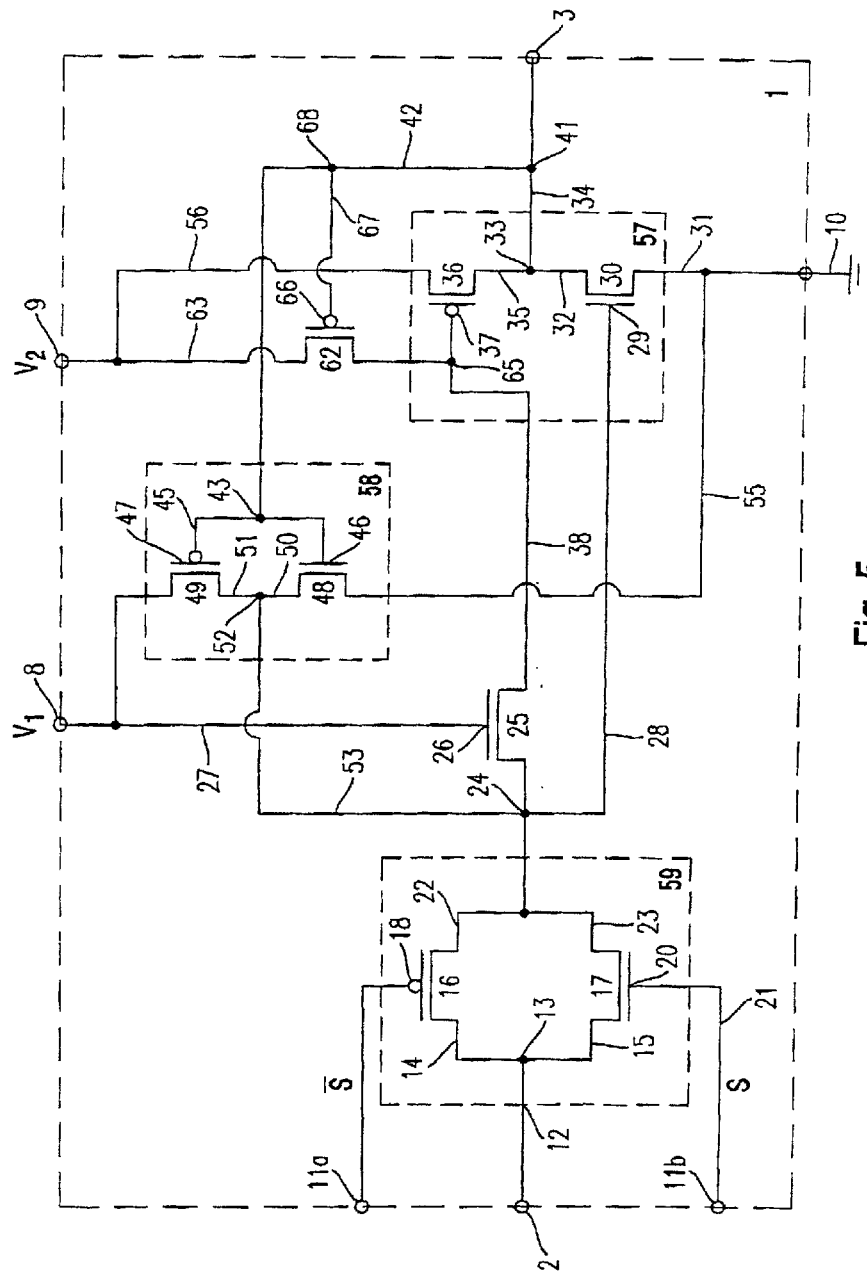
FIG. 5 shows a second embodiment of the data register according to the invention.

FIG. 5 shows a second embodiment of the data register 1 according to the invention, with corresponding components being provided with the same reference symbols.

In the second embodiment shown in FIG. 5, the output line 53 of the second inverter 58 is fed back to the potential node 24 between the controllable switching device 59 and the potential isolating transistor 25. The gate connection 29 of the NMOS field-effect transistor 30 of the first connection 29 of the NMOS field-effect transistor 30 in the first inverter circuit is connected via a line 28 to the node 24. In comparison to the first embodiment illustrated in FIG. 4, the data register 1 according to the second embodiment, as is shown in FIG. 5, has an additional PMOS field-effect transistor 62 which is connected via a line 63 to the second voltage potential v2, and is connected via a line 64 to a node 65. Furthermore, the PMOS field-effect transistor 62 has a gate connection 66, which is connected to the feedback line 42, via a line 67 with a node 68.

If the voltage potential at the data output 3 of the data register 1 falls while reading a logic-high data bit, the PMOS field-effect transistor 62 opens and the voltage potential at the node 65 rises to the second supply voltage potential v2. The signal output 3 is drawn via the PMOS field-effect transistor 30 to the reference ground potential at the reference ground potential connection 10. The feedback of the signal output 3 via the line 42 and the second inverter 58 results in the node 24 being kept constant at the first voltage potential V1. The advantage of the second embodiment, illustrated in FIG. 5, over the first embodiment, illustrated in FIG. 4, is that the voltage potential at the node 24 is kept constant, and is thus kept better defined.

In contrast, as is illustrated in FIG. 4, the first embodiment has the advantage over the second embodiment of the data register 1 according to the invention, as is shown in FIG. 5, that one less field-effect transistor is required.

FIGS. 6a to 6d show voltage waveforms at potential nodes in the data register according to the invention.

Figure 6A:
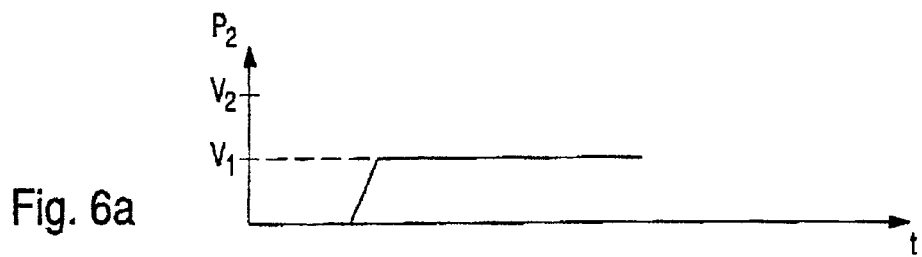
FIGS. 6a–6d show signal timing diagrams to explain the method of operation of the data register according to the invention.
Figure 6B:
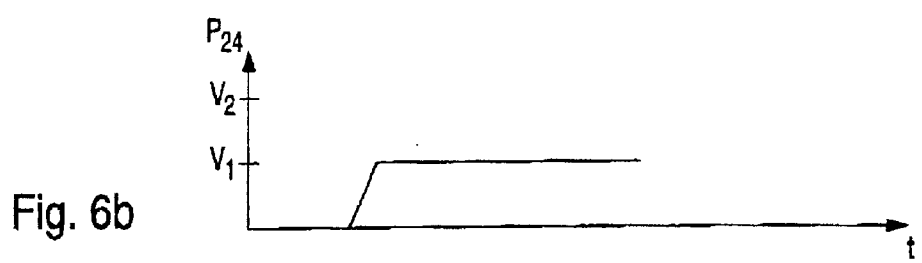

If, as is shown in FIG. 6a, a data bit input signal is applied to the signal input of the second data register and is passed on, this data input signal is passed with a short time delay to the potential node 24 of the data register, as is illustrated in FIG. 6b.

Figure 6C:
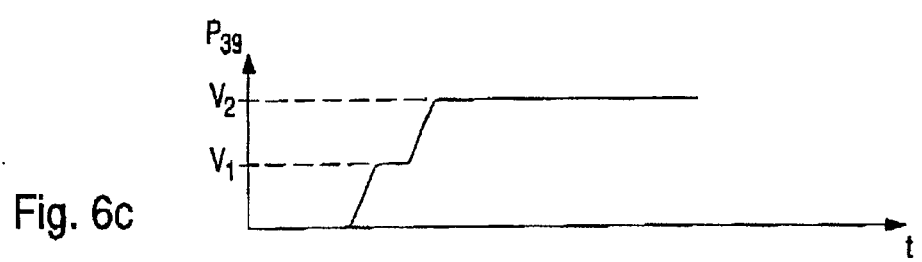
Figure 6D:
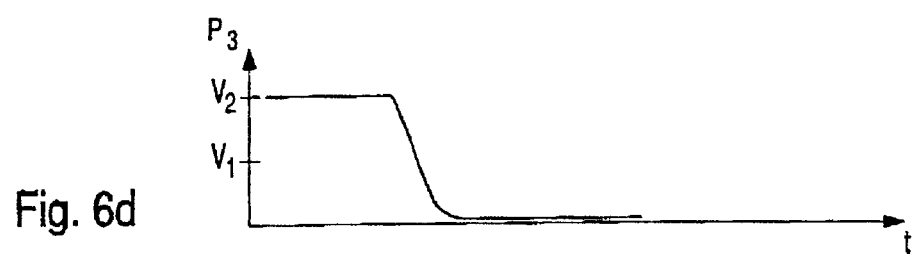

The potential waveform illustrated in FIG. 6c is produced at the potential node 32. The data signal which is applied to the signal input 2 is emitted at the signal output 3, and is output here for further data processing, with the voltage shift corresponding to the second voltage potential v2, however.

Figure 1A:
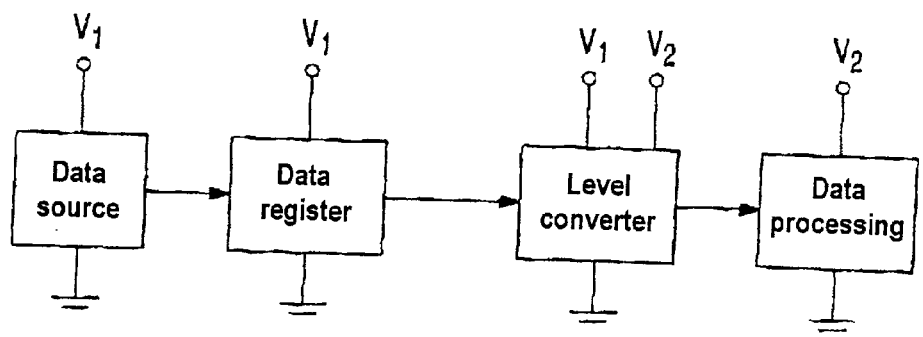
FIGS. 1a, 1b show circuit arrangements according to the prior art.
Figure 1B:
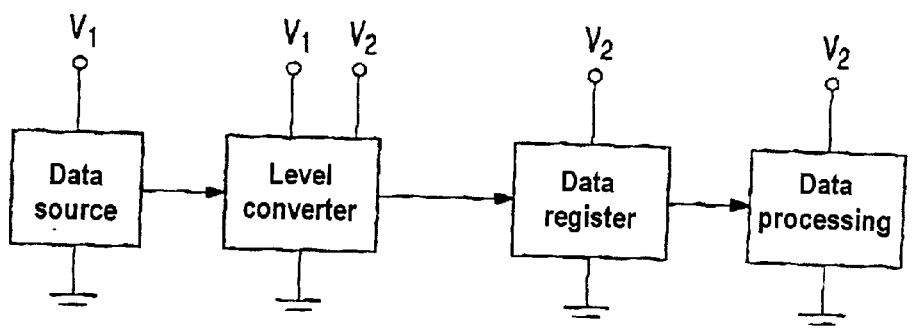
Figure 2:
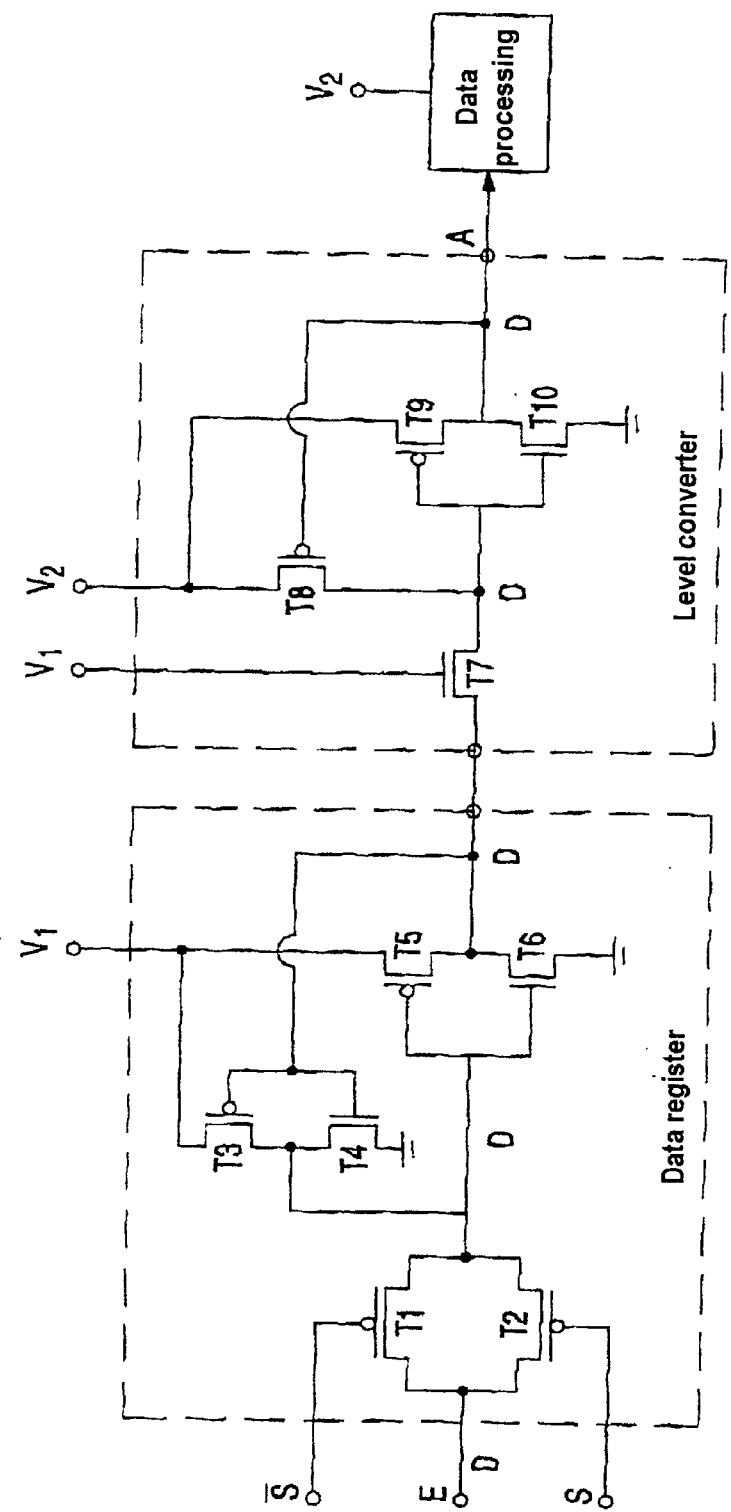
FIG. 2 shows a circuit diagram of a switching arrangement according to the prior art, in order to explain the disadvantages which occur in this case.

In the data register 1 according to the invention, transistors are saved in comparison to the circuit arrangement according to the prior art, as is illustrated in FIG. 2. While the conventional circuit arrangement, as is shown in FIG. 2, requires ten field-effect transistors T1 to T10 for buffer storage for level conversion of a data bit, the first embodiment of the data register as illustrated in FIG. 4 has only seven transistors, and the second embodiment of the data register according to the invention as illustrated in FIG. 5 has eight transistors. The surface area which is required by the data register 1 according to the invention for integration on a chip is thus very small, so that a considerable amount of surface area can be saved in comparison to conventional data registers. Furthermore, the signal delay times in the data register 1 according to the invention are shorter than in the conventional data register with downstream level converters since, for example, it is necessary to pass through five potential nodes from the data input E to the data output A in the conventional circuit arrangement shown in FIG. 2 while, in the case of data registers according to the invention, only four potential nodes are passed through, namely the potential nodes 13, 24, 39, 41. The switching times for application of a data bit, which originates from a data source, to a downstream data processing unit, which requires a higher potential voltage shift, are thus very short in the data register 1 according to the invention. The data register 1 according to the invention combines a data register cell with a level converter in a simple and compact circuit.

The present disclosure relates to subject matter contained in priority German Patent Application No. 101 20 672.0, filed on Apr. 27, 2001, the contents of which is herein expressly incorporated by reference in its entirety.

What is claimed is:

1. A data register that stores a data bit by integrated signal level conversion, comprising:

an input configured to apply a data bit input signal, the data bit input signal having a first voltage shift between a reference ground potential and a first voltage potential;

a controllable switch configured to pass on the applied data bit input signal;

a potential isolating transistor having a control connection at the first voltage potential;

a first inverter configured to emit, in inverted form, the passed on applied data bit input signal as a data bit output signal having a second voltage shift between the reference ground potential and a second supply potential, at one output of the data register, for further data processing; and a second inverter, configured to feed back the data bit output signal to a potential node associated with the potential isolating transistor.

2. The data register according to claim 1, wherein the first voltage potential is lower than the second supply potential.

3. A data register that stores a data bit by integrated signal level conversion, comprising:

an input configured to apply a data bit input signal, the data bit input signal having a first voltage shift between a reference ground potential and a first voltage potential;

a controllable switch configured to pass on the applied data bit input signal;

a potential isolating transistor having a control connection at the first voltage potential;

a first inverter configured to emit, in inverted form, the passed on applied data bit input signal as a data bit output signal having a second voltage shift between the reference ground potential and a second supply potential, at one output of the data register, for further data processing; and a second inverter, configured to feed back the data bit output signal for storage of the data bit, wherein the second inverter is supplied with the first voltage potential, the data bit output signal being fed back to a first potential node between said controllable switch and said potential isolating transistor.

4. The data register of claim 1, wherein said first inverter and said second inverter each have a PMOS field-effect transistor and an NMOS field-effect transistor.

5. The data register of claim 1, wherein said potential isolating transistor comprises an NMOS field-effect transistor.

6. The data register of claim 4, further comprising a feedback transistor configured to feed back the data bit output signal to gate connections of the field-effect transistors in said first inverter.

7. The data register of claim 6, wherein said feedback transistor comprises a PMOS field-effect transistor.

8. A data register that stores a data bit by integrated signal level conversion, comprising:

an input configured to apply a data bit input signal, the data bit input signal having a first voltage shift between a reference ground potential and a first voltage potential;

a controllable switch configured to pass on the applied data bit input signal;

a potential isolating transistor having a control connection at the first voltage potential;

a first inverter configured to emit, in inverted form, the passed on applied data bit input signal as a data bit output signal having a second voltage shift between the reference ground potential and a second supply potential, at one output of the data register, for further data processing; and a second inverter, configured to feed back the data bit output signal for storage of the data bit, wherein:
  said second inverter is supplied with the second supply potential; and
  the data bit output signal is fed back to a potential node between said potential isolating transistor and said first inverter.

9. The data register of claim 3, wherein:
  said first inverter has at least a NMOS field-effect transistor; and
  said first potential node is connected to a gate connection of said NMOS field-effect transistor in the first inverter.

10. The data register according of claim 1, wherein said controllable switch has a PMOS field-effect transistor and an NMOS field-effect transistor.

* * * * *

UNITED STATES PATENT AND TRADEMARK OFFICE
CERTIFICATE OF CORRECTION

PATENT NO. : 6,744,279 B2
DATED : June 1, 2004
INVENTOR(S) : H. Fischer et al.

It is certified that error appears in the above-identified patent and that said Letters Patent is hereby corrected as shown below:

Title page,
Item [56], References Cited, OTHER PUBLICATIONS, should include:
-- English Language Abstract for DE 187 38 726. --

Column 8,
Line 6, delete "according".

Signed and Sealed this

First Day of March, 2005

JON W. DUDAS
*Director of the United States Patent and Trademark Office*